(12) United States Patent
Mayder et al.

(10) Patent No.: US 7,459,921 B2
(45) Date of Patent: Dec. 2, 2008

(54) METHOD AND APPARATUS FOR A PADDLE BOARD PROBE CARD

(75) Inventors: Romi Mayder, San Jose, CA (US); John W. Andberg, Santa Cruz, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/444,645

(22) Filed: May 31, 2006

(65) Prior Publication Data

US 2007/0296424 A1   Dec. 27, 2007

(51) Int. Cl.
*G01R 31/02* (2006.01)

(52) U.S. Cl. .................................... 324/754

(58) Field of Classification Search ............... None
See application file for complete search history.

(56) References Cited

U.S. PATENT DOCUMENTS

| 4,746,861 | A | * | 5/1988 | Nesbitt | 324/761 |
| 4,757,254 | A | * | 7/1988 | Staples | 324/757 |
| 6,040,701 | A | * | 3/2000 | Swafford et al. | 324/754 |
| 6,160,408 | A | * | 12/2000 | Fenton | 324/754 |
| 6,548,756 | B2 | * | 4/2003 | Jones et al. | 361/736 |
| 6,833,696 | B2 | * | 12/2004 | Sinsheimer et al. | 324/158.1 |

* cited by examiner

*Primary Examiner*—Jermele M Hollington
(74) *Attorney, Agent, or Firm*—Holland & Hart, LLP

(57) ABSTRACT

A paddle board probe card for connecting a device under test with an ATE tester by means of ZIF connectors is presented. The paddle board probe card may include more than one printed circuit board mounted on a probe card in such a manner that the more than one printed circuit boards mate with ZIF connectors on an ATE testhead interface.

8 Claims, 4 Drawing Sheets

METHOD AND APPARATUS FOR A PADDLE BOARD PROBE CARD

BACKGROUND

A typical test head has thirty-six zero-insertion force connectors between the PEFPIF boards on the PE modules and the zero-insertion force flex circuit edge cards on a probe card. When mounting a probe card onto an ATE system, which uses ZIF connectors for the DUT interface, an appropriate mating surface has generally been created by wrapping a flex circuit around a plastic spine and connecting this spine to the probe card with an interposer or other connection technology.

FIG. 1 illustrates a high-speed connection assembly 100 for use between a device under test and automatic test equipment, such as an ZIF connector for use between a DUT board and a V5400 testhead. An exemplary high-speed connector is taught in U.S. Pat. No. 6,833,696 entitled Methods and Apparatus for Creating a High Speed Connection Between A Device Under Test And Automatic Test Equipment by Roger Sinsheimer et al. An exemplary automatic test equipment is the V5400 by Agilent Technologies, Inc. of Palo Alto, CA.

High-speed connection assembly 100 may include a DUT assembly or probe card 102 for translating electrical signals from a board 104 via a plurality of flex circuits 105 to a ZIF connection mechanism 106 with a plurality of clamping connectors 108 radially disposed around the connection mechanism to align with flex circuits 105 on the probe card 102.

The flex circuit has several limiting features when utilized as a connector means, including layer count. Flex circuits are currently limited to six layers, which limits the density of signals. Flex circuits are also currently limited in their electrical bandwidth. That is, a flex circuit is a lossy transmission line. Flex circuits are also limited in their mechanical dimensions, which limits the rows of contacts that a flex circuit can have between the probe card and the ATE system.

Therefore, there is a need for an improved connection means between a probe card and an ATE system that uses XZIF connectors.

BRIEF DESCRIPTION OF THE DRAWINGS

An understanding of the present teachings can be gained from the following detailed description, taken in conjunction with the accompanying drawings of which.

DETAILED DESCRIPTION

Figure 1:
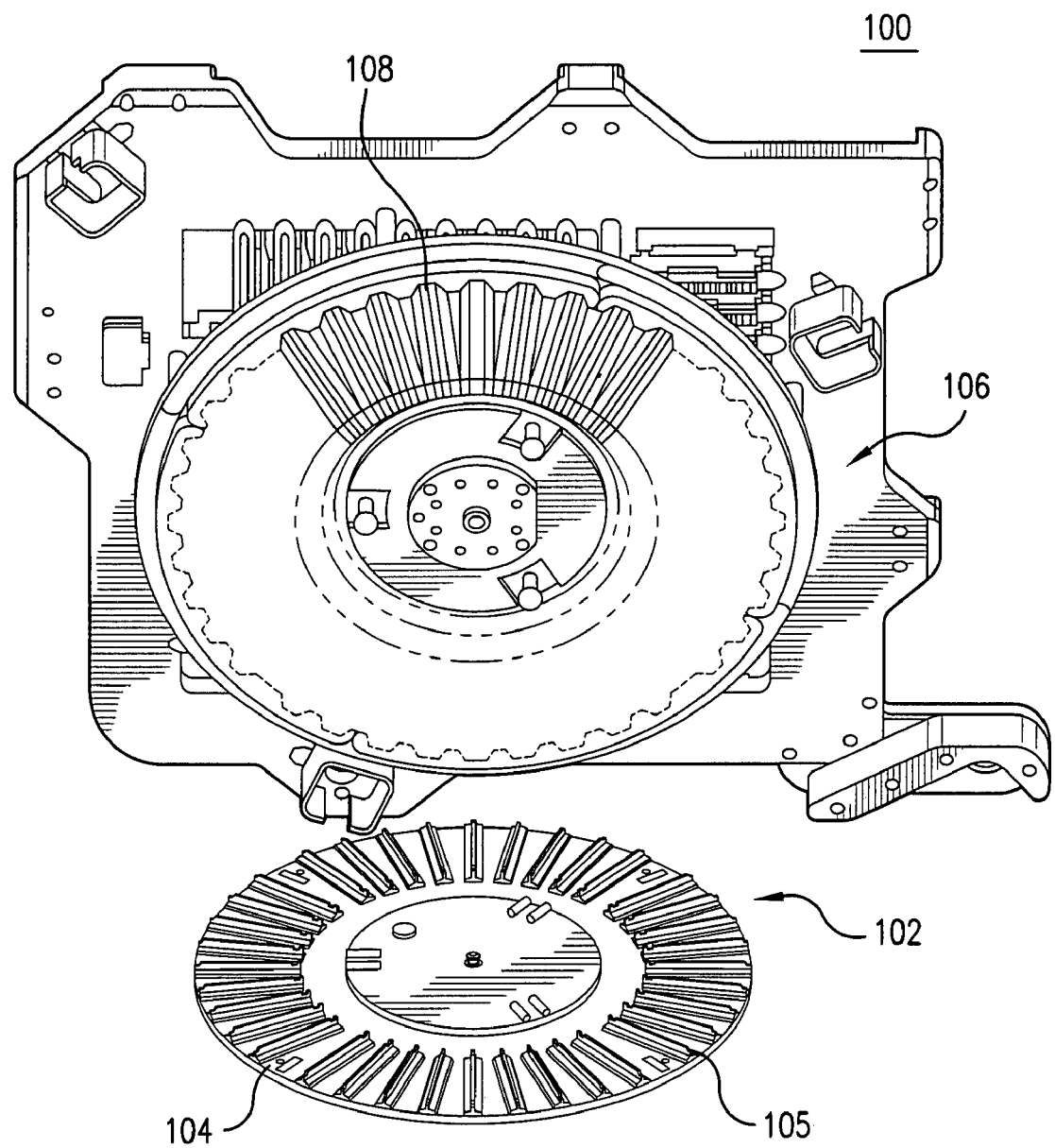
FIG. 1 illustrates a connector for connecting an ATE testhead and a device under test utilizing ZIF connectors on a testhead connecting to flex circuits on a probe card.
Figure 2:
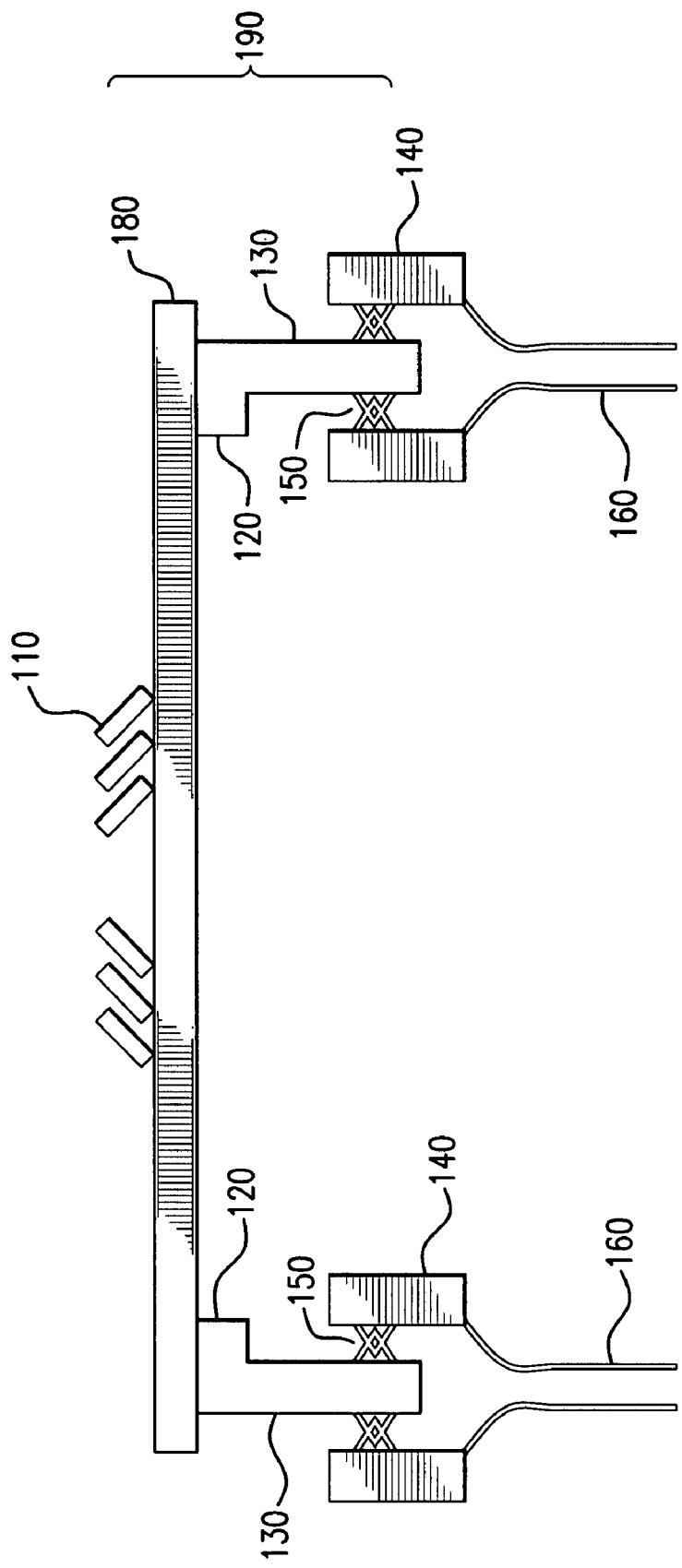
FIG. 2 illustrates a side, cut-away view of a paddle board probe card connecting with ZIF connectors on an ATE testhead in accordance with the present invention.

When mounting a probe card onto an ATE system, electrical contact must be made between the probe card and the electronics of the tester. If the DUT interface of the ATE system uses ZIF connectors, an appropriate mating surface must be created on the probe card. FIG. 2 illustrates a probe card 180 with printed circuit boards 130 mounted with a right angle connector 120 to attach a paddle board 130 to the probe card 180. The paddle board 130 may be mated with ZIF connectors 140 through interposer electrical contacts 150. The ZIF connectors may be electrically connected to the ATE system (not shown) at 160. Probe tip needles 110 may contact the device under test on the probe card 180.

The right angle connectors 120 may be any industry standard right angle connector, such as Teredyne's VHDM daughter board connector system or 3M's standard 2 mm hard metric right angle connector system. Many types of dielectric materials may be used to fabricate the printed circuit board of paddle board 130, including Nelco 4000-13 SI, Rogers 4000 series and other high speed materials. The length and width of the paddle board 130 may be chosen by the designer to optimize mechanical dimensional space constraints and pin count requirements.

Currently, printed circuit boards may be routed with line widths up to 20 mils. This minimizes the high frequency series resistance of the transmission line. This is an improvement over flex circuits, where the maximum trace width with a 50 ohm characteristic impedance is 10 mils. However, many fabrication houses can only process 5 mil wide lines on flex circuits.

The paddle board will have enough rows of contacts to support very high pin count applications. The layer count limitation of a common printed circuit board today is 60 layers, which is a 10× improvement in the number of layers to route signals over flex circuits, which are currently limited to 6 layers.

The paddle board may have active or passive circuitry contained thereon. For example, the paddle board may have circuitry that enables fanout of the address lines of memory devices, such as MCP, NAND, NOR or DRAM. Further, the paddle board may include circuitry for fanout of power supply and sense lines. Alternatively, the paddle board may include circuitry for fanout of I/O lines of memory devices, such as MCP, NAND, NOR or DRAM.

Figure 3:
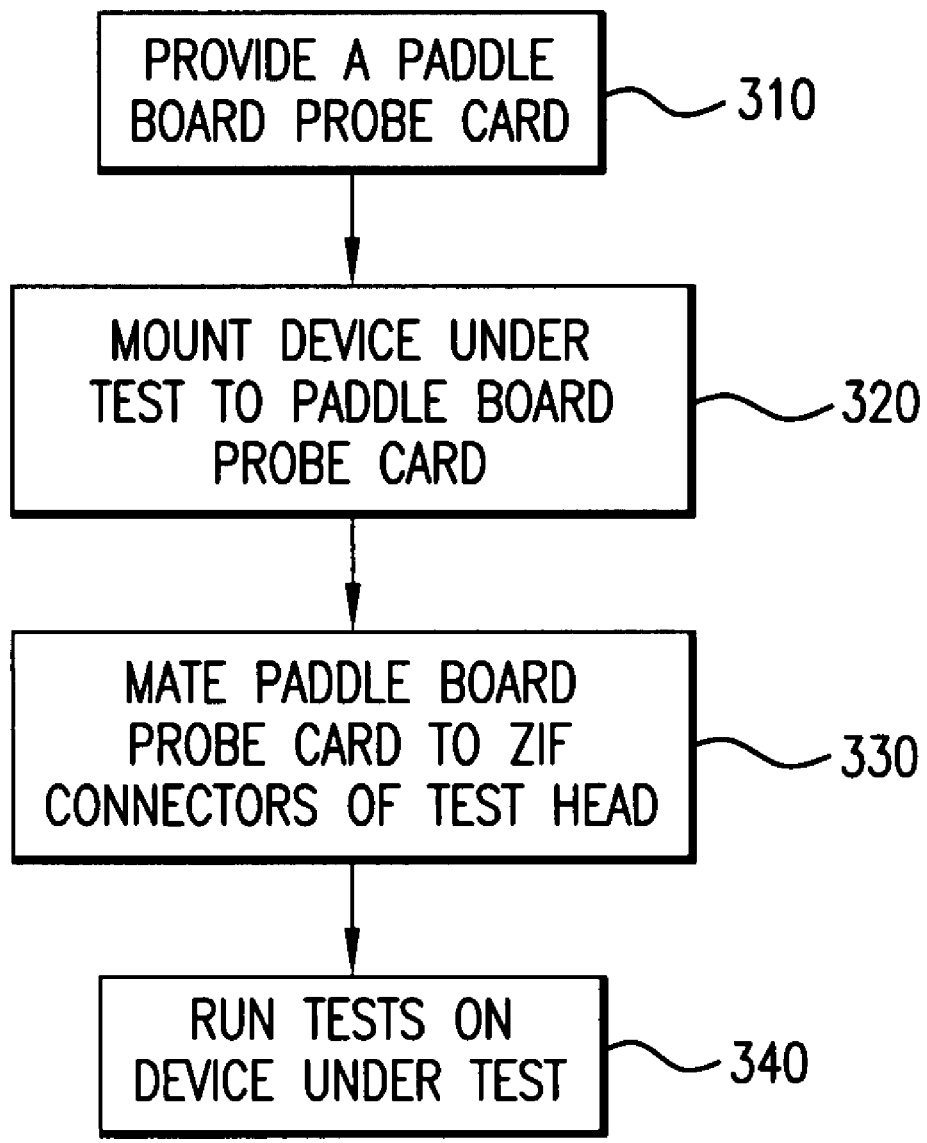
FIG. 3 shows a flow chart for a method of testing a device under test using a a paddle board probe card mated to a test head with ZIF connectors in accordance with the present invention.

FIG. 3 shows a flow chart for a method of testing a device using a paddle board probe card mated with an ATE tester with a ZIF connector 300. As shown in FIG. 3, a paddle board probe card 190 is provided 310. A device under test may be mounted 320 onto the paddle board probe card 190. The paddle board probe card 190 is mated 330 to ZIF connectors 140 on an ATE testhead (not shown). The device under test is then tested 340.

Figure 4:
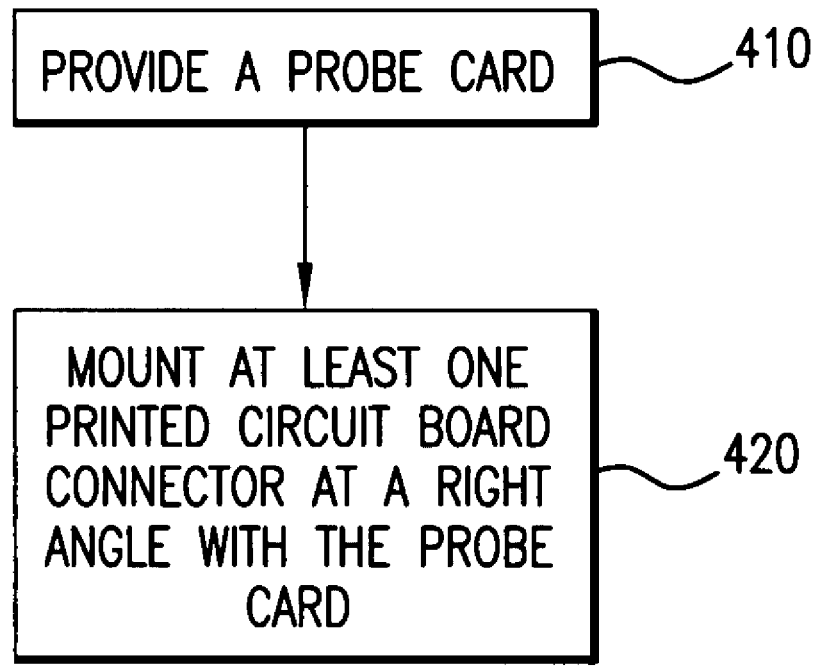
FIG. 4 shows a flow chart for a method of manufacturing a paddle board probe card in accordance with the present invention.

FIG. 4 illustrates a flow chart for a method of fabricating a paddle board probe card 400, in which a probe card is provided 410 and at least one printed circuit board 130 is mounted 420 at right angles with the probe card 180 to form a paddle board probe card 190 for mating with ZIF connectors 140 on an ATE testhead (not shown).

While the invention has been particularly shown and described with reference to specific embodiments thereof, it will be understood by those skilled in the art that changes in the form and details of the disclosed embodiments may be made without departing from the spirit or scope of the invention. For example, some of the descriptions of embodiments herein imply a certain orientation of various assemblies of which the system is constructed or a certain order of fabricating or mounting the assemblies. It will be understood, however, that the principles of the present invention may be employed in systems having a variety of spatial orientations or orders of fabrication or mounting and that therefore the invention should not be limited to the specific orientations or orders of fabrication or mounting shown.

The invention claimed is:

1. A paddle board probe card comprising:
   a probe card having a top side for mating with a device under test and a bottom side for mating with ZIF connectors of an ATE testhead; and
   a plurality of printed circuit boards mounted at a substantially right angle to the bottom side of the probe card, wherein the plurality of printed circuit boards are configured to mate with the ZIF connectors of the ATE testhead.

2. The paddle board probe card according to claim 1, wherein the plurality of printed circuit boards are mounted to the bottom side of the probe card with respective right angle connectors.

3. The paddle board probe card according to claim 1, wherein the plurality of printed circuit boards comprise circuitry for fanout of address lines of memory devices.

4. The paddle board card according to claim 1, wherein the plurality of printed circuit boards comprise circuitry for fanout of power supply and sense lines.

5. The paddle board card according to claim 1, wherein the plurality of printed circuit boards comprise circuitry for fanout of I/O lines of memory devices.

6. A method of fabricating a paddle board probe card comprising:
   providing a probe card with a top side and a bottom side; and
   mounting a plurality of printed circuit boards at substantially right angles to the bottom side of the probe card, wherein the plurality of printed circuit boards are configured to mate with ZIF connectors of an ATE testhead.

7. The method of fabricating a paddle board probe card according to claim 6, wherein the plurality of printed circuit boards are mounted to the probe card with respective right angle connectors.

8. A method for testing a device under test comprising:
   providing a paddle board probe card with printed circuit boards mounted at substantially right angles to a bottom side of the paddle board probe card;
   mounting the paddle board probe card to an ATE test head by mating the printed circuit boards mounted on the bottom side of the paddle board probe card to ZIF connectors on the ATE test head;
   mounting the device under test to a top side of the paddle board probe card; and
   running at least one test on the device under test.

* * * * *